(12) United States Patent
Vasquez et al.

(10) Patent No.: US 6,709,953 B2
(45) Date of Patent: Mar. 23, 2004

(54) METHOD OF APPLYING A BOTTOM SURFACE PROTECTIVE COATING TO A WAFER, AND WAFER DICING METHOD

(75) Inventors: Barbara Vasquez, München (DE); David Wallis, Dresden (DE); Sylvia Winter, Laussnitz (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/062,942

(22) Filed: Jan. 31, 2002

(65) Prior Publication Data

US 2003/0143818 A1 Jul. 31, 2003

(51) Int. Cl.[7] .................. H01L 21/301; H01L 21/46; H01L 21/78
(52) U.S. Cl. .................. 438/460; 438/113; 438/114; 438/462; 438/464
(58) Field of Search .................. 438/113, 114, 438/460, 462, 463–465

(56) References Cited

U.S. PATENT DOCUMENTS

| | | | | |
|---|---|---|---|---|
| 3,616,345 A | * | 10/1971 | Van Dijk | 148/DIG. 37 |
| 4,722,130 A | * | 2/1988 | Kimura et al. | 29/413 |
| 5,110,388 A | * | 5/1992 | Komiyama et al. | 156/229 |
| 6,023,094 A | | 2/2000 | Kao et al. | |
| 6,083,811 A | * | 7/2000 | Riding et al. | 438/416 |
| 6,338,980 B1 | * | 1/2002 | Satoh | 438/106 |
| 6,413,838 B2 | * | 7/2002 | Itoh | 438/125 |
| 6,429,036 B1 | * | 8/2002 | Nixon et al. | 428/57 |
| 6,440,822 B1 | * | 8/2002 | Hayama et al. | 438/113 |
| 2002/0055238 A1 | * | 5/2002 | Suigino et al. | 438/459 |

* cited by examiner

Primary Examiner—John Niebling
Assistant Examiner—Angel Roman
(74) Attorney, Agent, or Firm—Laurence A. Greenberg; Werner H. Stemer; Ralph E. Locher

(57) ABSTRACT

The present invention provides a new backside treatment of the wafer. Trenches are cut into the top surface of the wafer by sawing or etching, and after grinding the wafer from the bottom side, a protective material is applied as a surface layer to the bottom surface while filling the trenches with this material. The material is hardened in order to accomplish the sawing process. In another embodiment of the present method, a double foil layer is applied to the rear side of the wafer including a mounting tape and a protective layer facing the wafer rear side.

4 Claims, 1 Drawing Sheet

METHOD OF APPLYING A BOTTOM SURFACE PROTECTIVE COATING TO A WAFER, AND WAFER DICING METHOD

BACKGROUND OF THE INVENTION

Field of the Invention

The invention lies in the semiconductor processing technology field. More specifically, the present invention relates to a method for applying a protective coating to a bottom surface of a semiconductor wafer or to the bottom surface and all four lateral surfaces, including edges and corners, of partially singulated or presawn semiconductor dies which are still in wafer form, especially with regard to the mechanical protection of backside, corners, and edges of semiconductor chips during final singulation of integrated circuits on the wafer, the wafer is diced by sawing or etching along parallel lines. During the sawing process, the edges of the chips are subject to various damage sources, such as splitting or chipping. In addition, with the increasing volume of flip-chip-in-package and waferlevel package, the handling of bare dies without convention packages in component test and assembly of the fragile silicon corners and edges of the dies. According, a protection of the semiconductor dies is required.

U.S. Pat. No. 6,023,094 to Kao et al. describes a semiconductor wafer having a bottom surface protective coating. That protective film on the bottom surface is intended to aid in preventing chipping during the wafer dicing process, and is formed by any process suitable for applying a thick film. In one embodiment, a screen printing process is utilized. There, a screen is placed over the bottom surface and the material to be deposited is dragged by means of a squeegee. By way of another example, a spinning type process may be used, wherein a thick film is spread across the bottom surface of the wafer.

A holding structure is utilized to protect the wafer during the application of the thick film. The wafer is mounted onto a mounting tape, the thick protective film facing the mounting tape. Any suitable cutting device is utilized to separate the dies from one another. Additionally, the protective film is intended to improve adhesion to the mounting tape, making it possible to use mounting tapes with inferior adhesion strength.

SUMMARY OF THE INVENTION

It is accordingly an object of the invention to provide an improved method for applying a protective coating to a bottom surface of a semiconductor wafer, which overcomes the above-mentioned disadvantages of the heretofore-known devices and methods of this general type and which provides sufficient protection against damage and allows for easy processing.

In addition, it is an object of this invention to provide a mechanical protection of backside, corners, and edges of semiconductor chips during final singulation and subsequent handling and assembly.

With the foregoing and other objects in view there is provided, in accordance with the in invention, a method of applying a protective coating to a bottom surface of a wafer, or to the bottom surface and all four lateral surfaces, including edges and corners, of partially singulated or presawn semiconductor dies which are still in water form which comprises the steps of:

forming trenches in a top surface of the wafer;

applying a top side dicing tape to the top surface;

grinding the wafer at a bottom surface opposite the top surface and thereby laying open the trenches;

applying a protective material on the bottom surface and filling the trenches; and hardening the protective material to form a protection layer.

The forgoing method is advantageously applied to the final dicing of a semiconductor wafer with the protective coating in place. In that case, the following additional steps are performed:

fixing the protection layer to a mounting tape for fastening the wafer onto a dicing frame;

removing the top side dicing tape;

dicing the wafer into dies through the hardened protective material previously formed in the first dicing trenches; and picking the dies off the mounting tape.

With the above and other objects in view there is also provided, in accordance with another embodiment of the invention, a method of applying a protective coating to a bottom surface of a wafer or to the bottom surface and all four lateral surfaces, including edges and corners, of partially singulated or presawn semiconductor dies which are still in wafer form, which comprises the steps of:

forming trenches in a top surface of the wafer;

applying a top side dicing tape to the top surface;

grinding the wafer at a bottom surface opposite the top surface and thereby laying open the trenches;

applying a glue layer onto a mounting tape; and mounting the wafer on the mounting tape and causing the glue to fill the trenches.

Again, this method is expediently utilized in a method of dicing a semiconductor wafer, which comprises:

applying a protective coating to a bottom surface of the wafer as above, and further removing the top side dicing tape;

dicing the wafer into dies through the hardened protective material previously formed in the first dicing trenches; and picking the dies off the mounting tape.

Finally, there is also provided, in accordance with the invention, a method of applying a protective coating to a bottom surface of a wafer, which comprises the following steps:

applying a protective foil onto a mounting tape; and mounting a bottom surface of the wafer onto the mounting tape with the protective foil facing the wafer.

The method is advantageously utilized for dicing a semiconductor wafer, whereby the following steps are performed:

applying a protective coating to a bottom surface of the wafer or to the bottom surface and all fours lateral surfaces, including edges and corners, of partially singulated or presawn semiconductor dies which are still in wafer form as outlined above; and further dicing the wafer including the protective foil into dies; and picking the dies with the protective foil off the mounting tape.

In accordance with a concomitant feature of the invention, the mounting tape is a UV-foil; and the step of picking off the dies includes applying UV-radiation to separate the UV-foil from the protective foil.

Once more in summary, to achieve the foregoing and other objects, the present invention provides a new backside treatment of the wafer. Trenches are cut into the top surface of the wafer by sawing or etching, and after grinding the wafer from the bottom side, a protective material is applied as a surface layer to the bottom surface while filling the trenches with this material. The material is hardened in order to accomplish the subsequent sawing process. In another embodiment of the present method, a double foil layer is applied to the rear side of the wafer including a mounting tape and a protective layer facing the wafer rear side.

Other features which are considered as characteristic for the invention are set forth in the appended claims.

Although the invention is illustrated and described herein as embodied in a method for applying a protective coating to a bottom wafer surface or to the bottom surface and all four lateral surfaces, including edges and corners, of partially singulated or presawn semiconductor dies which are still in wafer form, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
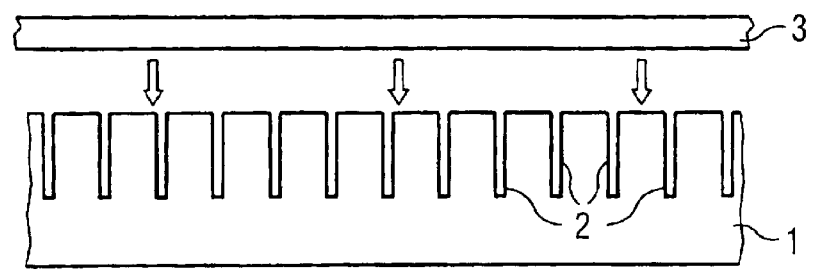
FIGS. 1 to 3 are diagrammatic sectional views of a wafer after different steps of the manufacturing process.

Referring now to the figures of the drawing in detail and first, particularly, to FIG. 1 thereof, in a first embodiment of the invention, trenches, especially provided as dicing channels, are cut into the top surface of the wafer according to the lines of separation between the chips to be diced. The trenches can be sawn or etched or formed by laser cutting, for example. The chips are not yet separated, as the trenches are cut to a certain depth only. FIG. 1 shows a section to a certain depth, not separating the dies. A top side dicing tape 3 covering the integrated circuits fabricated on the wafer is applied to the top surface in the direction of the arrows.

Figure 2:
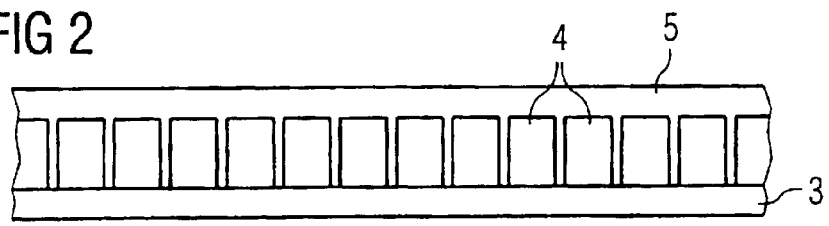

Following this kind of a dicing-before-grinding methodology, the thickness of the wafer is then reduced from the bottom side by a usual grinding process. In the course of this grinding process, the trenches are laid bare and are opened on the bottom surface. FIG. 2 shows the remaining wafer 4 upside down, after a protective material 5 has been applied to the bottom surface opposite to the top side, which still carries the top side dicing tape 3. The protective material 5 is a low viscosity material, which will form a thin, planar protection layer across the bottom surface of the wafer, at the same time filling all of the trenches or dicing channels. To this end, an appropriate material, for example a varnish or resist, thermoplastic, an epoxy, a UV-curable polymer, or other polymeric materials, especially one polymer ceramic known by the name of Ormocer™ can be poured onto the bottom surface and distributed with slow spin. Alternatively, an appropriate material can be applied by using a screen printer system in a process that is equivalent to the process described in the above-mentioned U.S. Pat. No. 6,023,094. Other suitable or preferred methods for applying the material are spray coating and molding.

Instead of applying a continuous surface layer only, the trenches are filled with the protective material as well. Dicing channels are typically only 50 micrometers wide. Therefore a sufficiently low viscosity is a requirement for an adequate choice of the protective material. Further to that, the protective material is chosen so that it can be hardened or will lose its low viscosity or fluidity in the course of the fabrication process; thus it will form a protection layer and can be sawn in a later process step.

Figure 3:
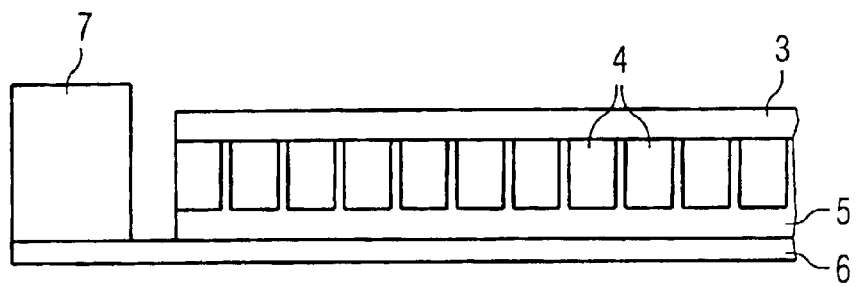

FIG. 3 shows a section of the remaining wafer 4, now made up of the dies 4 that are held together by the protective material 5, after the wafer has been mounted on a mounting tape 6 and fastened to a dicing frame 7. The top side dicing tape 3 is removed so that the protective material 5 in the dicing channels between the dies 4 can be cut. Preferably, a saw with a thinner blade than the instrument possibly used to cut the trenches is used to separate the dies 4. Thereafter the dies can be picked off the mounting tape 6. Conversely, the final singulation of the now protected backside assembly of dies can be done by laser cutting.

An especially preferred variant embodiment comprises a thick glue layer applied to the mounting tape before mounting the wafer comprising the dies 4 that are fastened by the top side dicing tape after the grinding process; this glue layer substitutes the separate application of the protective material 5 by a screen printer system or a resist spinning equipment. In this embodiment, the bottom surface of the wafer—that is the surface opposite to the surface with the top side dicing tape 3—is brought into contact with the glue layer on the mounting tape. The glue layer is intended to fill the trenches between the dies 4 and takes essentially the same space as the protective material 5 shown in FIG. 3. The glue layer can be hardened using ultraviolet light, for instance; instead, it is possible to apply a sort of glue that will become harder after a short intermediate time interval. The glue has the property to adhere to the dies 4 while relatively easily detaching from the mounting tape 6. So the hardened glue layer remains on the backsides of the separated dies.

An alternative procedure of applying a protective layer on the backsides of the dies comprises the application of a double foil layer as a mounting tape. To this end, a protective second foil is laminated to the mounting tape that is intended to be used for mounting the wafer to the dicing frame. The wafer is mounted to the mounting tape, the protective foil of the double foil layer facing the wafer. Thus the bottom surface of the wafer is put into contact with the protective foil. In the process of dicing the protective foil is cut together with the dies of the wafer.

The separated chips are picked off the mounting tape with the appertaining part of the protective foil adhering to the bottom surface of each separate die. The adhesive strength between the mounting tape proper and the protective foil is adjusted inferior to the adhesive strength between the protective foil and the semiconductor material of the wafer. This can be accomplished by adjusting the adhesive forces acting between the layers, or by means of an ultraviolet foil used as mounting tape. Such an ultraviolet foil is detached from the material to which it is applied by use of ultraviolet radiation. The UV radiation destroys the adhesive bonds between the foil and the substrate. Also a thermally conductive foil may be used as protective foil, especially if a later application of the IC-chips requires an appropriate heat conductance across the backside of the chips.

Figure 4:
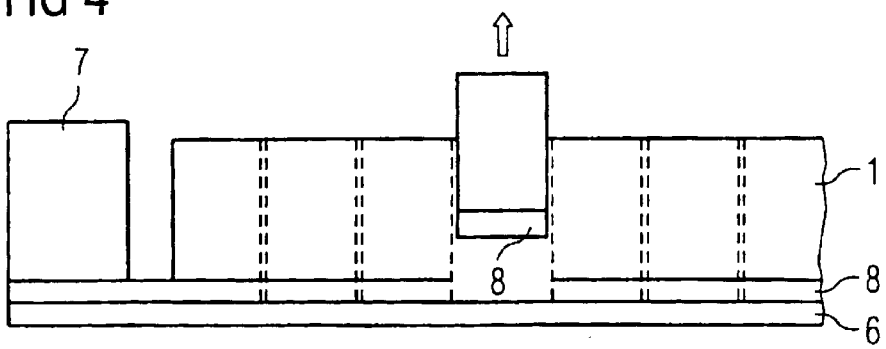
FIG. 4 is a section similar to FIG. 3 for an alternative fabrication method.

FIG. 4 shows the arrangement of the wafer 1 with laminated mounting tape 6 and protective foil 8 on the bottom surface as mounted to the dicing frame 7. The sawn trenches or dicing channels are indicated with broken lines. The arrow shows the direction in which a separated die is removed, when it is picked off the mounting tape 6. The appertaining part of the protective foil 8 remains at the bottom of the individual die.

We claim:

1. A method of applying a protective coating to a bottom surface of a wafer, and of protecting bottom edges and corners of chips forming part of the wafer, which comprises the steps of:

forming trenches in a top surface of the wafer;

applying a top side dicing tape to the top surface;

grinding the wafer at a bottom surface opposite the top surface and thereby laying open the trenches;

applying a protective material on the bottom surface and at the same time filling all the trenches to protect the bottom surface and the bottom edges and corners; and hardening the protective material to form a protection layer.

2. A method of dicing a semiconductor wafer, which comprises:

applying a protective coating to a bottom surface of the wafer in accordance with claim 1; and further fixing the protection layer to a mounting tape for fastening the wafer onto a dicing frame;

removing the top side dicing tape;

dicing the wafer into dies through the hardened protective material; and picking the dies off the mounting tape.

3. A method of applying a protective coating to bottom surface of a wafer, and of protective bottom edges and corners of chips forming part of the wafer, which comprises the steps of:

forming trenches in a top surface of the wafer;

applying a top side dicing tape to the top surface;

grinding the wafer at a bottom surface opposite the top surface and thereby laying open the trenches;

applying a glue layer onto a mounting tape; and mounting the wafer on the mounting tape and at the same time causing the glue to fill all the trenches to protect the bottom surface and the bottom edges and corners.

4. A method of dicing a semiconductor wafer, which comprises:

applying a protective coating to a bottom surface of the wafer in accordance with claim 3; and further removing the top side dicing tape;

dicing the wafer into dies through the hardened glue; and picking the dies off the mounting tape.

* * * * *